United States Patent [19]

Kameyama et al.

[11] Patent Number: 4,715,318

[45] Date of Patent: Dec. 29, 1987

[54] PHOTOCHEMICAL REACTION APPARATUS

[75] Inventors: Masaomi Kameyama; Koichi Matsumoto, both of Tokyo, Japan

[73] Assignee: Nippon Kogaku K.K., Tokyo, Japan

[21] Appl. No.: 819,801

[22] Filed: Jan. 16, 1986

[30] Foreign Application Priority Data

| Jan. 17, 1985 | [JP] | Japan | 60-4991 |
| Apr. 16, 1985 | [JP] | Japan | 60-79362 |
| Jun. 7, 1985 | [JP] | Japan | 60-122791 |

[51] Int. Cl.$^4$ .................. H01L 21/205; H01L 21/263
[52] U.S. Cl. .................... 118/722; 118/50.1; 118/725; 156/643; 219/121 LT
[58] Field of Search ............... 118/719, 722, 724, 725, 118/50.1; 427/53.1, 54.1; 219/121 LR, 121 LT, 121 L; 156/643

[56] References Cited

U.S. PATENT DOCUMENTS

| 4,480,168 | 10/1984 | Cielo et al. | 219/121 L |
| 4,568,632 | 2/1986 | Blum et al. | 427/53.1 X |

*Primary Examiner*—Evan K. Lawrence
*Attorney, Agent, or Firm*—Michael N. Meller

[57] ABSTRACT

An apparatus for photochemically processing a silicon wafer placed in a reactive gas by an illuminating energy for etching or film forming purposes. The apparatus includes a reaction chamber in which the silicon wafer is positioned and the reaction chamber is filled with a gas which is photochemically reactive to the illuminating energy. An opening is formed through the wall of the reaction chamber and the silicon wafer is positioned within the chamber apart from the opening. Condensing means for condensing the light energy from the illuminating energy radiating means at around the opening and directing the same into the chamber is arranged outside the chamber.

15 Claims, 15 Drawing Figures

4,715,318

PHOTOCHEMICAL REACTION APPARATUS

BACKGROUND OF THE INVENTION

1. Field of the Invention

The present invention relates to a photochemical reaction apparatus which is applicable to the process of photochemical vapor deposition and more particularly to an apparatus for photochemically processing a silicon wafer placed in a reactive gas by the use of illuminating energy.

2. Description of the Prior Art

Included among the known manufacturing processes of semiconductor devices are semiconductor integrated circuits is a photochemical reaction process in which a silicon wafer is placed in a chamber filled with a reactive gas and an optical energy is vertically or horizontally projected onto the silicon wafer thereby etching the wafer or depositing a film on the wafer.

The gas contained in the chamber may be composed of Chlorine ($Cl_2$) or the like in the case of photochemical reaction for wafer etching purposes and silane ($SiH_4$) or the like in the case of photochemical reaction for the purpose of depositing a film on a wafer.

The chamber is provided with a window made of a glass material such as quartz for the purpose of externally introducing optical energy such as ultraviolet or far-ultraviolet beam into the chamber and preventing the flowing out of the gas within the chamber. Thus, there is the disadvantage of causing the deposition of an $SiO_2$ film by photochemical reaction on the inner surface of the window during the projection of the optical energy and causing damage to the window by the photoetching. As a result, the transmittance of the window is deteriorated and the exposure efficiency is decreased thus necessitating frequent replacement of the window.

To overcome these deficiencies, attempts have been made so that $N_2$ gas is blown to the window so as to make the window hardly stainable or the window is coated with an oil or the like so as to make it easy to remove the stain and these methods have been incapable of producing satisfactory effects.

SUMMARY OF THE INVENTION

It is an object of the present invention to provide a photochemical reaction apparatus which has excellent exposure efficiency and capable of stable exposure.

It is another object of the invention to provide a photochemical reaction apparatus which is capable of uniform deposition or etching of an element such as a silicon wafer.

It is still another object of the invention to provide a photochemical reaction apparatus which is small in size and capable of a film quality enhancing laser annealing during the film growing operation.

DESCRIPTION OF THE PREFERRED EMBODIMENTS

Figure 1:
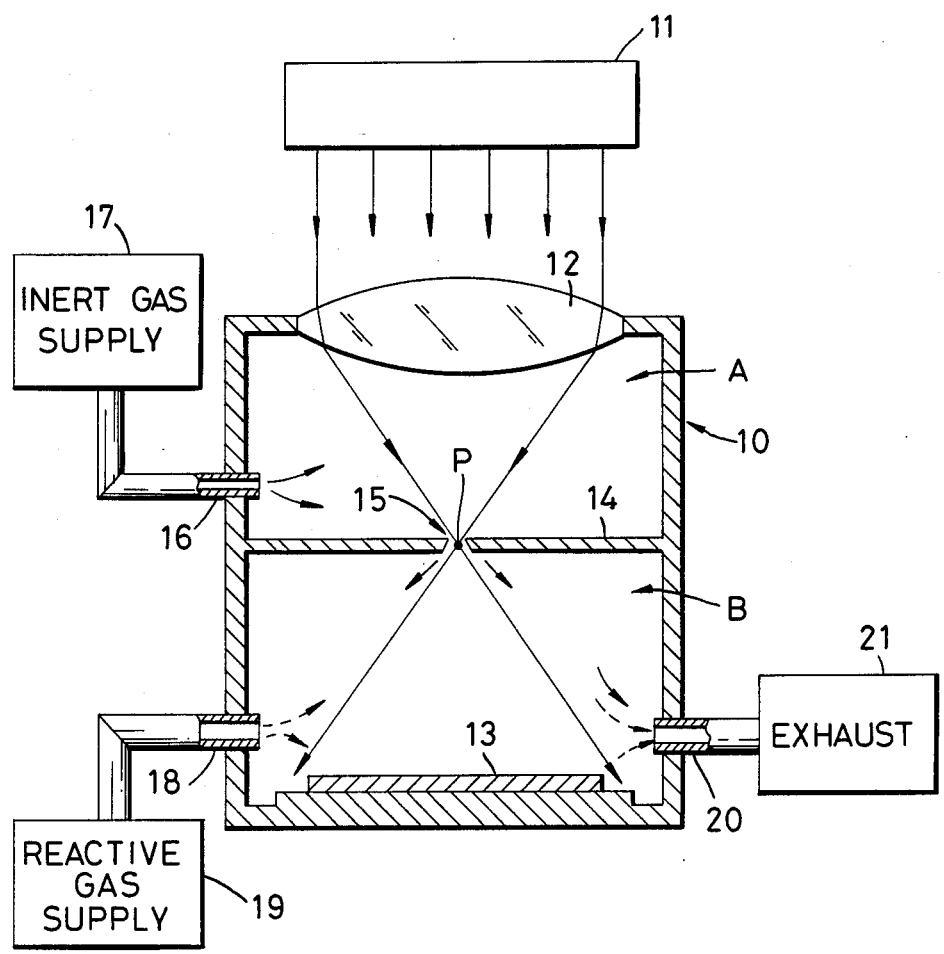
FIG. 1 is a longitudinal sectional view showing a first embodiment of the invention.

Referring to FIG. 1, there is illustrated a first embodiment of the invention in which optical energy is directly projected onto an element. A light source 11 comprising for example an excimer laser for emitting a far-ultraviolet beam is arranged above a housing 10. The beam projected from the light source 11 is introduced into the housing 10 through a condenser lens 12. Arranged on the inner bottom of the housing 10 is the element a semiconductor wafer 13, which is to be formed with a photochemically processed film on its surface.

While the condenser lens 12 is schematically shown in the form of a single lens structure for simplicity of illustration, it may comprise in fact an optical system including a plurality of lenses. The beam refracted by the condenser lens 12 is condensed at a point P which is above and apart by a given distance from the surface of the semiconductor wafer 13. Arranged near to the point P is a partition wall 14 for dividing the space between the condenser lens 12 and the wafer 13. The partition wall 14 may for example be one which is uniformly coated with a chemically stable high-molecular film. The partition wall 14 is centrally formed with a small opening 15 of a size required for passing the condensed beam. In this embodiment, the point P is positioned at the center of the small opening 15.

The partition wall 14 divides the inner space of the housing 10 into upper and lower parts to provide a protective chamber A and a reaction chamber B. The protective chamber A is purged with an inert gas such as $N_2$, $H_2$, He or Ar so as to prevent absorption of the far-ultraviolet beam. The reaction chamber B is filled with a gas such as $SiH_4$ or $SiH_6$ for photochemically processing the wafer 13 or $Cl_2$ for photoetching the wafer 13.

The inert gas is supplied under given pressure into the protective chamber B from an inert gas supply 17 through a pipe 16. Also, the photochemically reactive gas is supplied into the reaction chamber B from a reactive gas supply 19 through a pipe 18.

The reaction chamber B is also connected to an exhaust system 21 through a pipe 20. These units adjust the gas pressure within the protective chamber A higher than the gas pressure within the reaction chamber B. The beam emitted from the light source 11 is imaged at the point P so that the beam illuminates the reactive gas right above the wafer 13 and then it illuminates the surface of the wafer 13. This illuminating beam photochemically changes the gas, e.g., $SiH_4$ or $SiH_6$ to $SiO_2$ to form a film on the surface of the wafer 13. Since the pressure of the inert gas within the chamber A is higher than the pressure of the gas within the chamber B, the inert gas flows into the chamber B through the small opening 15 as shown by the arrows. On the other hand, the reactive gas within the chamber B is prevented from flowing into the chamber A. Thus, there is no danger of the reactive gas contacting the condenser lens 12 and hence there is no danger of the reaction products depositing on the lens 12 or damaging the lens 12. After the reaction has taken place, the gases introduced into the chambers A and B are discharged to the outside of the housing 10 through the pipe 20.

Then, where a single lens such as the lens 12 is used as an illuminating optical system, there results a light intensity distribution such that the illuminance on the processing surface of the element is in the direction of the outer periphery. Thus, in order to make uniform the illuminance on the processing surface, it is desirable to use an illuminating optical system which provides a light intensity distribution tending to increase the light intensity in the peripheral portion. For example, if $I(\theta)$ represents the light intensity distribution at the point P, $I(0)$ the light intensity on the line (optical axis) passing through the point P and vertical to the processing surface and $\theta$ the angle formed by the beam passing through the point P and the optical axis, it is preferable to design an illuminating optical system which satisfies $I(\theta)=I(0)/\cos^3 \theta$.

Figure 2:
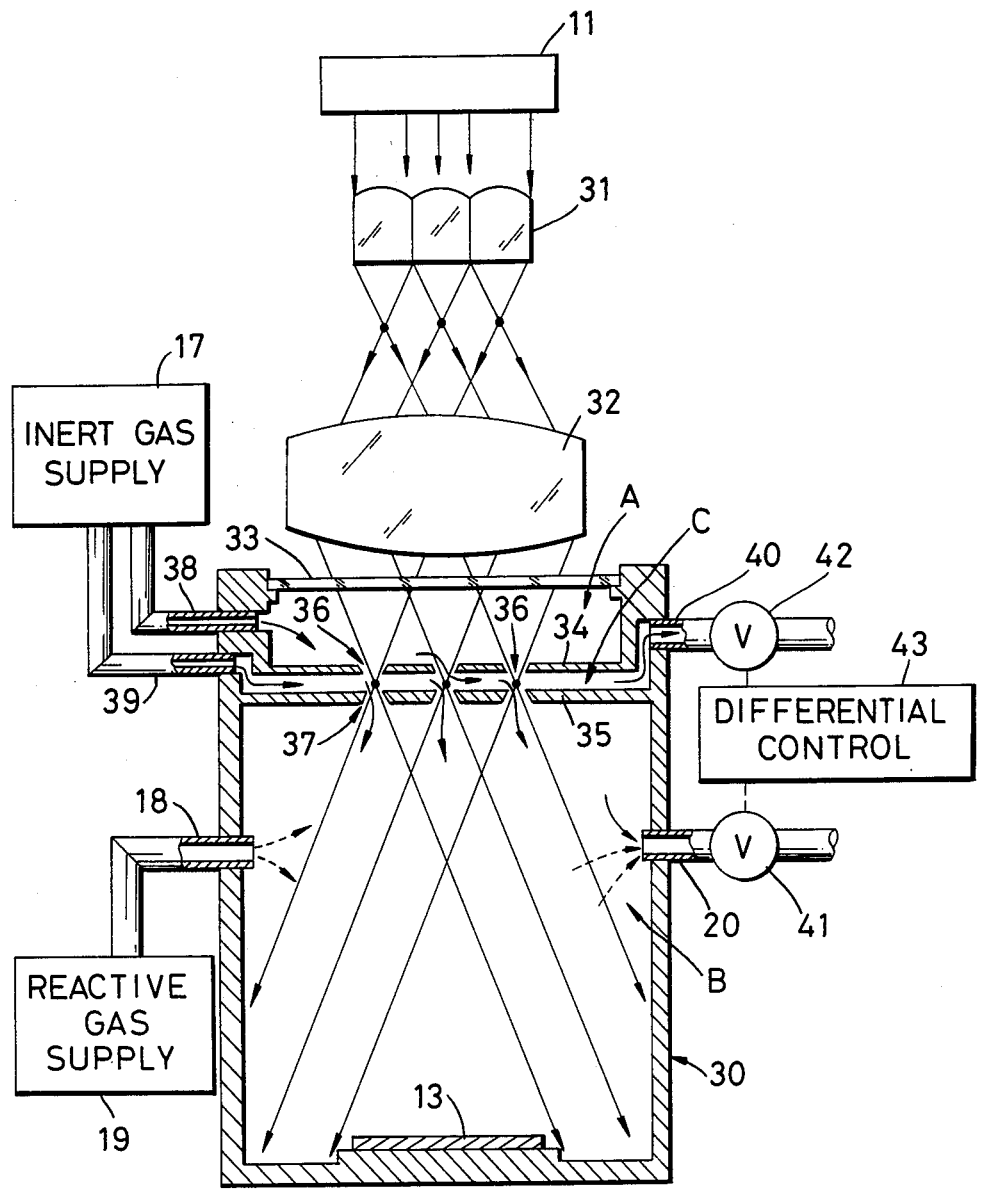
FIG. 2 is a longitudinal sectional view showing a second embodiment of the invention.

FIG. 2 shows a second embodiment of the invention. In order to eliminate irregularities within the beam from a light source 11 and uniformly illuminate a reactive gas right above a wafer 13, an optical integrator 31 comprising a fly-eye lens, an assembly of small lenses, is arranged below the light souce 11 to provide a plurality of secondary light sources. A condenser lens 32 is arranged below the optical integrator 31.

The upper surface of a housing 30 is formed with a transparent window 33 made of a glassy material such as quartz so as to stabilize the atmosphere within the housing 30. The housing 30 is divided into protective and reaction chambers A and B and an intermediate communication space C by upper and lower partition walls 34 and 35 which are arranged one upon another. The upper and lower partition walls 24 and 35 are respectively formed with small openings 36 and 37 having a size required for passing the beam and arranged near the images of the secondary light sources formed by a condenser lens 32.

It is to be noted that in this embodiment the flyeye lens 31 is arranged so that the light beams from the individual small lens overlap each other on the surface of a wafer 13 thereby making uniform the illuminance of a reactive gas right above the wafer 13. Alternatively, it may be so arranged that the images of the secondary light sources are practically formed on the same plane as the small openings 37. However, by arranging so that the images of the secondary light sources are formed on the plane located practically centrally in the communication space C as in the present embodiment, there is the advantage of arranging the condensing points at a slight distance apart from the small openings 36 and 37, respectively, and thereby decreasing the temperature rise of the partition walls 34 and 35.

An inert gas is supplied under given pressure into the chamber A and the communication space C through pipes 38 and 39, respectively, from an inert gas supply 17 and a reactive gas is supplied into the chamber B from a reactive gas supply 19 through a pipe 18. These gases are discharged through a pipe 20. Also, the communication space C is provided with an exhaust pipe 40 for discharging the inert gas to the outside.

In this apparatus, the pressure in the communication space C is adjusted higher than the pressure in the chamber B. Thus, there is no danger of the gas within the chamber B flowing into the chamber A and the communication space C. Also, the exhaust pipes 20 and 40 are respectively provided with valves 41 and 42 which are differentially controlled by a differential control unit 43 so that a proper differential pressure is produced between the space C and the chamber B and the atmosphere is divided so as to prevent the reactive gas within the chamber B from reaching the chamber A.

Figure 3:
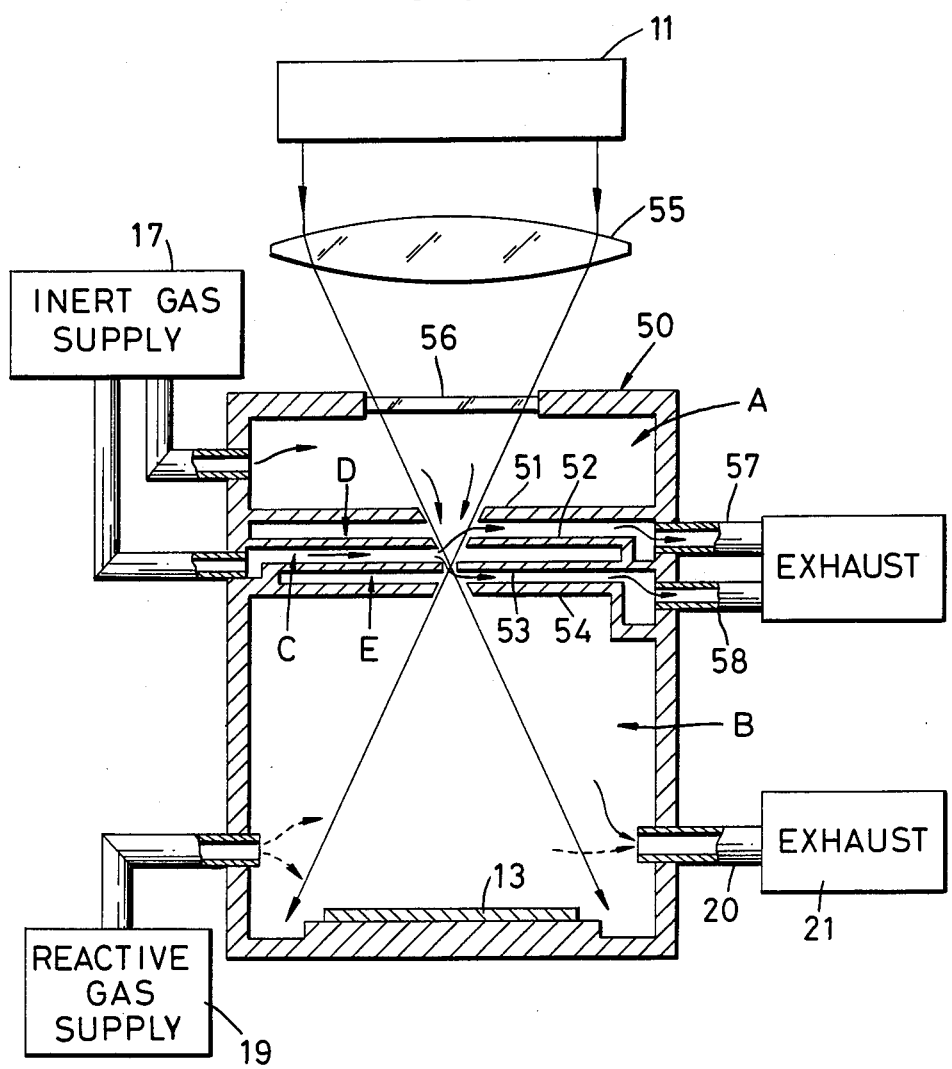
FIG. 3 is a longitudinal sectional view showing a third embodiment of the invention.

FIG. 3 shows a third embodiment of the invention. A housing 50 includes first, second, third and fourth partition walls 51, 52, 53 and 54 arranged one upon another at a predetermined distance apart and each of them is formed with a small opening having a required size corresponding to the width of a light beam to pass the beam through it. The light beam emitted from a light source 11 through a condenser lens 55 is condensed at the center of the small opening of the third partition wall 53 through a window 56 of the housing 50. The housing 50 is divided to define a protective chamber A, a reaction chamber B and three communication spaces C, D and E arranged between the chambers A and B. An inert gas is supplied into the chamber A and the communication space C from an inert gas supply 17. The inert gas flowing into the spaces D and E through the small openings is discharged through exhaust pipes 57 and 58, respectively.

In this embodiment, it is designed so that the pressures within the chambers A and B and the communication spaces C, D and E are $A>C>B>D\geq E$ or $C\geq A>B>D\geq E$ and thus the reactive gas within the chamber B is prevented from flowing into the chamber A.

With the construction of this embodiment, the degree of separation between the protective and reaction chambers A and B is better than the previously-described embodiments and there is no danger of the deposition of substances on the window 56 due to the reactive gas. Even with this embodiment, its effects can be further improved by performing a suitable differential exhaust.

While, in the above-described embodiment, the four partition walls are arranged one upon another, five or more partition walls may be used and the same effects can be obtained by flowing the gases at high velocity in addition to the exhaust function among the partition walls.

Figure 4:
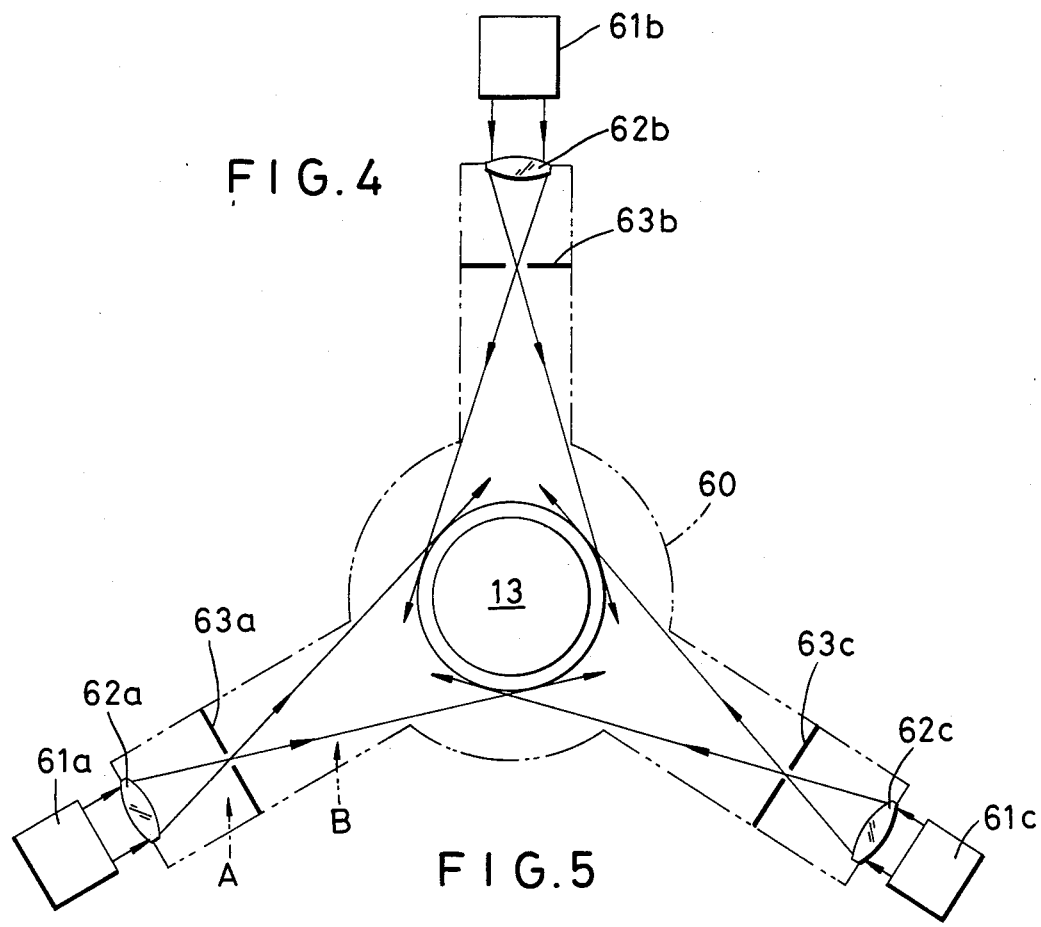
FIG. 4 is a plan view showing a fourth embodiment of the invention.
Figure 5:
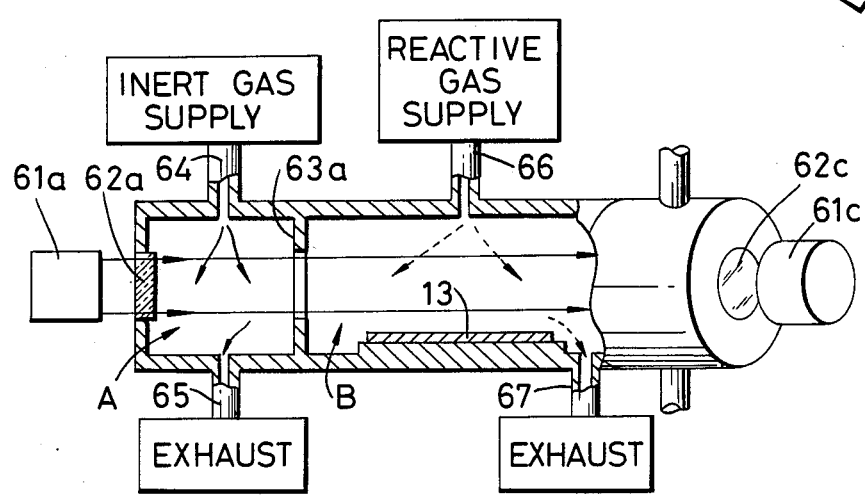
FIG. 5 is a longitudinal section view of the embodiment in FIG. 4.

FIGS. 4 and 5 show a fourth embodiment of the invention. In the previously described embodiments, the vertical illumination method is used in which an excitation beam is vertically projected onto an element to cause the desired photochemical reaction. This is done for the purpose of illuminating the reactive gas as well as the element and thereby increasing the photochemical reaction rate. On the contrary, the apparatus according to the fourth embodiment of FIG. 4 shows the case of a horizontal illumination in which light beams are projected horizontally or substantially horizontally to the processing surface of an element. In this case, each excitation beam is not directly projected onto the element but it is projected only to the reactive gas just above the processing surface of the element.

A hermetically sealed cylindrical housing 60 includes three radially projected hollow tubes and mounted at the forward ends of the hollow tubes are cylindrical lens 62a, 62b and 62c each having a positive power within a plane parallel to the surface of a wafer 13. Partition walls 63a, 63b and 63c having slits at or near the condensing points of the cylindrical lenses 62a, 62b and 62c are arranged so as to separate protective chambers A in which these cylindrical lenses are mounted from a reaction chamber B in which the wafer 13 is placed and the light beam from each of light sources 61a, 61b and 61c is condensed through one of the cylindrical lenses into a linear beam at around the slit. The light beams passed through the slits are passed as substantially parallel beams through the space right above the wafer 13. The chamber B is provided with a reactive gas inlet pipe 66 and an exhaust pipe 67.

In this embodiment, it is also necessary to control the pressures within the spaces so that the reactive gas within the chamber B is prevented from flowing into the chambers A. Also, by decreasing the vertical size of the light beams above the wafer processing surface, it is possible to correspondingly decrease the height of the slits and improve the degree of separation between the spaces and the chamber. While, in this embodiment, a single slit is provided in the vicinity of the projecting opening of each optical system, it is possible to use a multi-slit structure comprising two or more slits with the addition of exhaust means. Also, while each of the cylindrical lenses is shown as including a single lens, it may be composed of a group of lenses so as to optimize the light intensity distribution within the illuminated area.

Figure 6:
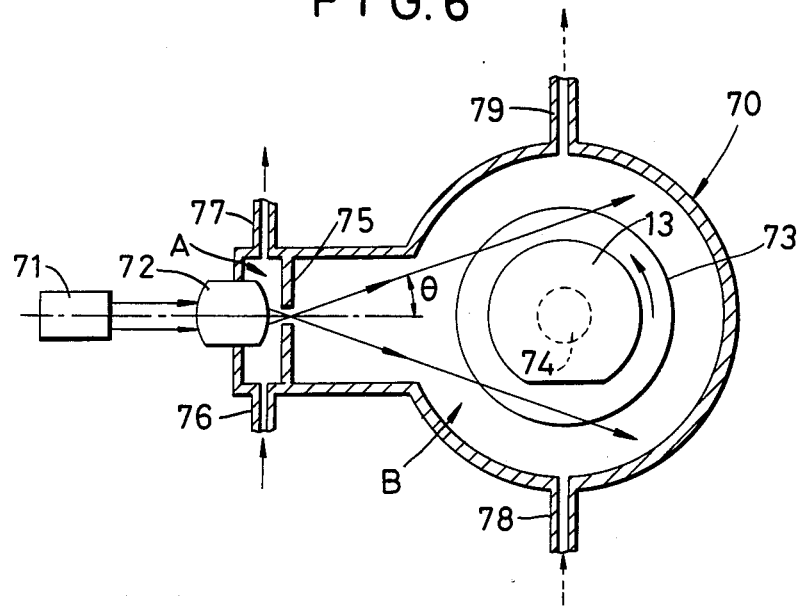
FIG. 6 is a plan sectional view showing a fifth embodiment of the invention.
Figure 7:
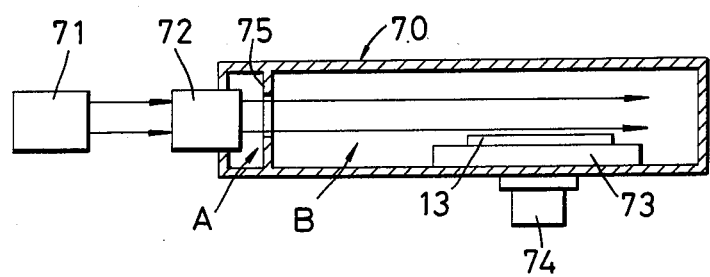
FIG. 7 is a cross-sectional view of FIG. 6.

FIG. 6 shows a fifth embodiment of the invention. A cylindrical housing 70 includes a turning table 73 arranged on its inner bottom and a wafer 13 is placed on the turning table 73 which is rotated by a motor 74. A far-ultraviolet light 11 comprising an excimer laser or the like is turned on so that the emitted light beam is passed through a cylindrical lens 72 to form a focal line on the slit formed in a partition wall 75 and the light beam is distributed within the range of its elevation angle $\pm\theta$. As will be seen from FIG. 7, the light beam proceeds above the wafer 13 in parallel to its surface. Thereafter, nitrogen gas or an inert gas is introduced into a protective chamber A through a pipe 76 so that a part of the gas is discharged through a pipe 77 and the remaining gas is introduced into a reaction chamber B through the slit. Then, a photochemically reactive gas is introduced through a pipe 78 attached to the housing 70 so that the reactive gas is discharged as an exhaust gas while progressing the processing of the wafer 13.

This embodiment of the invention has the following three features.

The first feature resides in that the turning table is arranged inside the reaction chamber and the turning table is rotated by the motor provided outside the housing.

The wafer mounted on the turning table tends to uniformly contact the reactive gas distributed within the reaction chamber and thus there is the effect of eliminating the occurrence of "processing nonuniformity".

The second feature is common with the fourth embodiment and it resides in that the focal line of the light beam is formed at an intermediary position between the beam condensing cylindrical lens and the wafer and the position of the focal line coincides with the position of the slit.

The third feature resides in that consideration is given to the light intensity distribution constituting a cause of the nonuniformity in the chemical reaction of the wafer placed in the photochemical reactive gas. In other words, the constants of the cylindrical lens and the like are selected so that the light beam passed through the cylindrical lens has a given sine condition deficit amount and in this way the proper light intensity is provided at any given elevation angle of the light beam spread in the form of a fan thereby also causing the distribution of the photochemical reaction to tend to become uniform.

In other words, this embodiment combines the above-mentioned characteristic techniques and realizes a photochemical reaction apparatus capable of processing a making element by means of a uniform chemical reaction.

Figure 8:
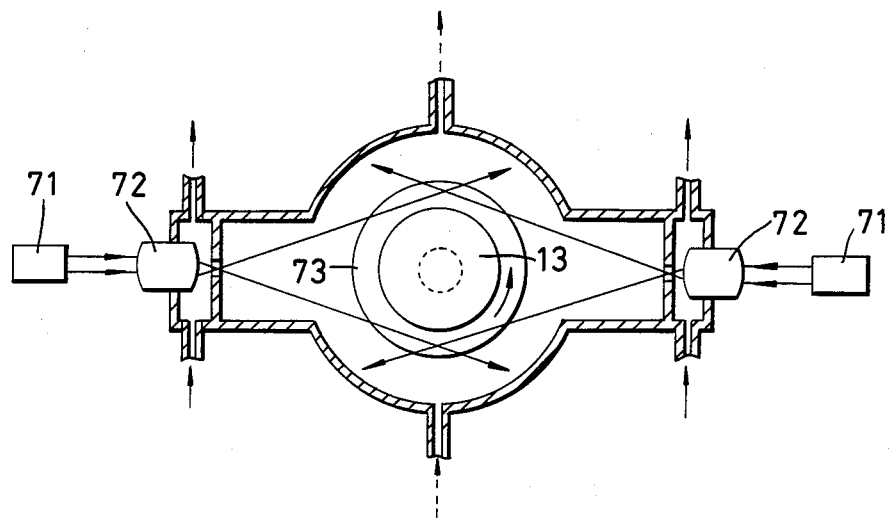
FIG. 8 is a plan sectional view showing a modification of the fifth embodiment.

A modification of this embodiment is shown in FIG. 8 in which the light source 71 is arranged at each of the right and left sides so that more uniform light intensity distribution is provided for the wafer 13 on the turning table 73 and also the light intensity of the photochemical reaction light beam above the wafer surface is increased by two times. Thus, there is the effect of reducing the processing time.

Figure 9A:
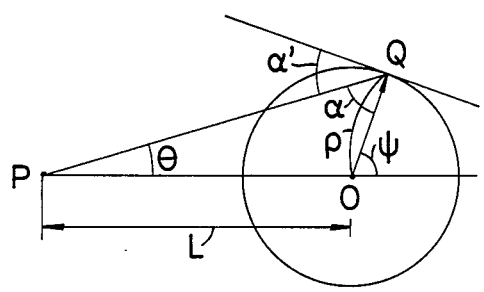
FIGS. 9A and 9B are diagrams useful for explaining the construction of the optical system.

This technique will now be described briefly on the basis of the optical systems used in the above-mentioned embodiments. Referring to FIG. 9A, let it be assumed that symbol P represents a line image formed by the optical system and symbol O represents the center of rotation of the wafer. Now notes a point Q on the wafer. If $E_\psi$ represents the illuminance (the incident light energy per unit length and unit time) at the circumferential line element of the point Q, then the following holds $$E_\psi(\rho \cdot \phi) = I\theta \frac{1 \cos \alpha 1}{\overline{PQ}} = I(\theta) \frac{1\rho + L \cos \phi 1}{L^2 + \rho + 2L\rho\cos\phi} \quad (1)$$

where $I(\theta)$ is the light intensity (the emitted light energy per unit angle and unit time) and $\alpha$ represents the angle formed by the normal line perpendicular to the circumferential line element of the point Q and the line $\overline{PQ}$.

Then, if $E_\gamma$ represents the illuminance at the radial line element of the point Q, then the following holds $$E_\gamma(\rho \cdot \phi) = I(\theta) \frac{1 \cos \alpha' 1}{\overline{PQ}} = I(\theta) \frac{1 L \sin \phi 1}{L^2 + \rho^2 + 2L\rho\cos\phi} \quad (2)$$

Therefore, the total energy received at the point Q is given by $E_\psi + E_\gamma$.

Now considering the fact that the photochemical reaction is caused by a single-photon process or two-photon process, the reaction proceeds in proportion to the first or second power of the light energy at the noted point and therefore the power is represented by $\beta(1<\beta<2)$. Thus, in order that a uniform photochemical reaction may take place on the wafer, the quantity obtained by integrating $(E_\psi + E_\gamma)\beta$ in the direction of rotation of the wafer must be constant. In other words, it is necessary that the following is not dependent on the value of the radius $\Psi$.

$$E = \frac{1}{2\pi} \int_0^{2\pi} (E + E_\gamma)^\beta d\phi \quad (3)$$

FIGS. 10A to 10D show examples of calculations made by using the light intensity distribution $I(\theta)$ given as follows $$I(\theta) = I(0)(1 + \alpha\theta^2) \quad (4)$$

Figure 10A:
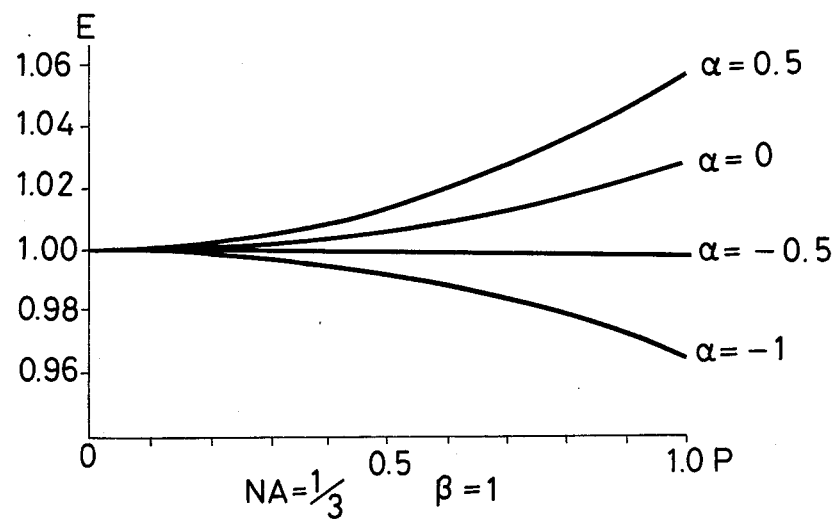
FIGS. 10A, 10B, 10C and 10D are graphs showing the relations between the light intensity and the uniformity in the amount of photochemical reaction.
Figure 10B:
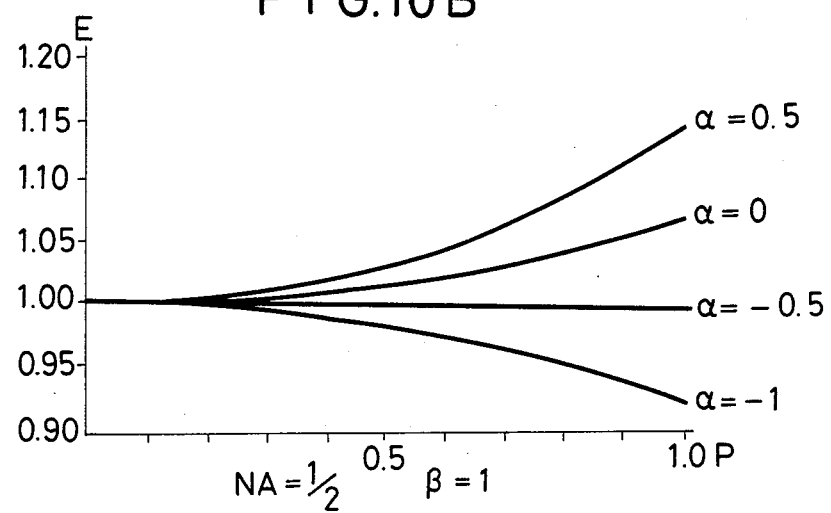

FIGS. 10A and 10B show the cases of $\beta = 1$ in which the abscissa represents the radial distance ($\rho$) of the wafer and the ordinate represents the values of E givent by the equation (3) or the amount of progress of the photochemical reaction on the wafer surface. Designated by NA is the value of sin $\theta$max when the maximum value of $\theta$ is given as $\theta$max. Also, the value of E is normalized so that it becomes 1 when $\rho = 0$. From these results it will be seen that it is desirable to select $\alpha \approx -0.5$ in the case of photochemical reactions with $\beta = 1$.

Figure 10C:
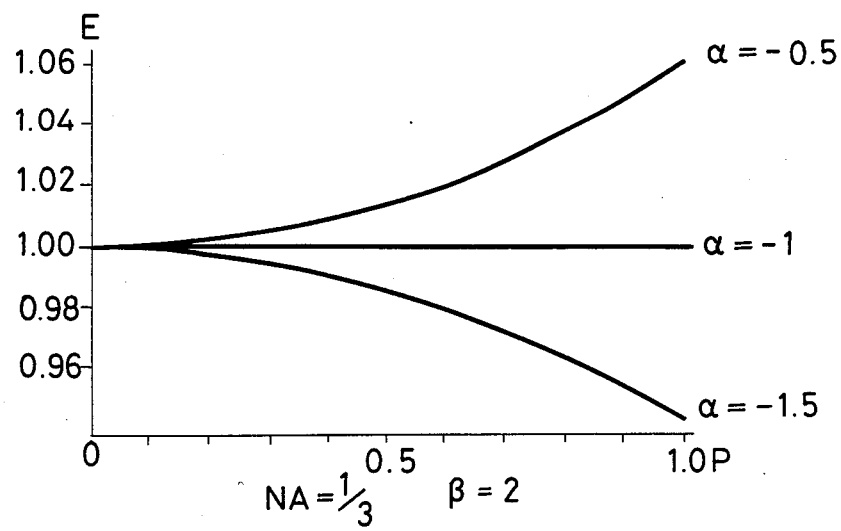
Figure 10D:
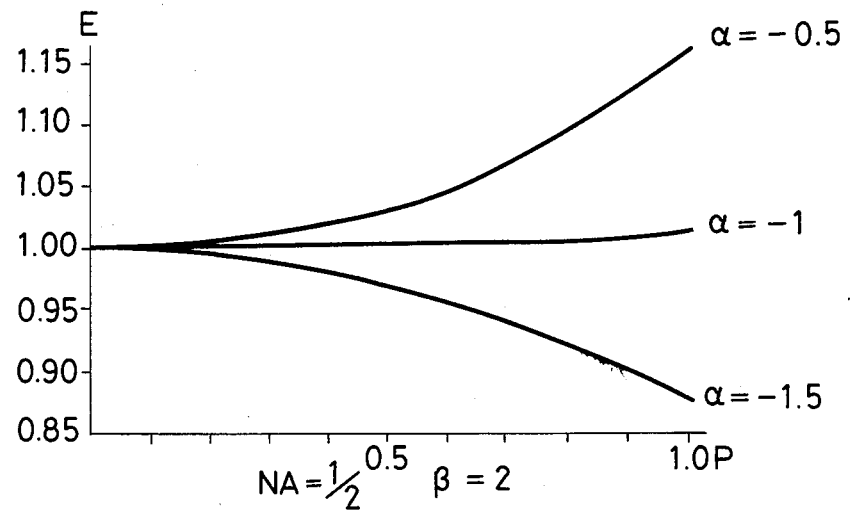

FIGS. 10C and 10D show the results of the similar calculations made with $\beta \times 2$. From these results it will be seen that it is desirable to select $\alpha \approx -1$ in the case of photochemical reactions with $\beta = 2$.

From the foregoing it will be seen that the proper light intensity distribution for the images of line sources is on the order of $-1.6 < \alpha < -0.4$.

Figure 9B:
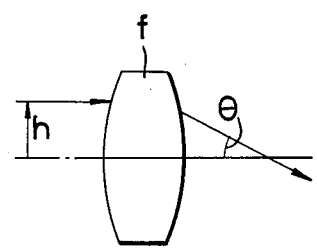

The desired optical system for realizing these line source images will now be discussed. Referring again to FIG. 9B, it is assumed that the incident luminous flux density is represented as M (the transmitted energy per unit length and unit time) and its value is constant. The luminous flux is preserved thus giving the following $$Mdh = I(\theta)d\theta \quad (5)$$

Also, if f represents the focal length of the optical system and $SC(\theta)$ represents the sine condition deficit amount of the optical system, then the following holds $$h = [f + SC(\theta)] \sin \theta \quad (6)$$

Solving a differential equation on the basis of the equations (4), (5) and (6), we obtain $$SC(\theta) = f\left(\frac{1}{\sin\theta}\left\{\theta + \frac{\alpha}{3}\theta^3\right\} - 1\right) \quad (7)$$

Thus, it is only necessary to use an optical system having a sine condition deficit quantity given by the equation (7).

A description will now be made of a sixth embodiment of the invention in which a far-ultraviolet light source and a light source of other than far-ultraviolet beam are used to alternately perform a deposition process and an etching and film quality improving process on an element placed in a reactive gas within a chamber through an optical system.

Figure 11:
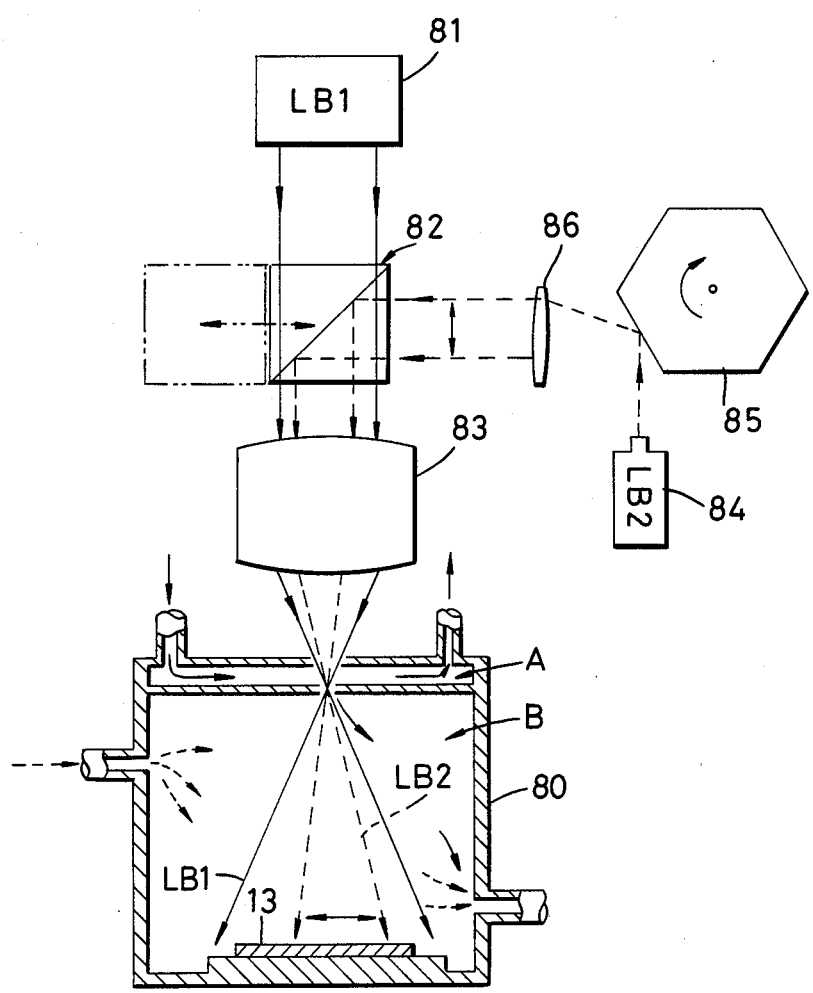
FIG. 11 is a schematic diagram showing the construction of a sixth embodiment of the invention.

FIG. 11 shows the sixth embodiment. A first light source 81 for emitting a far-ultraviolet beam $LB_1$ comprises an excimer laser or the like. A beam splitter or simple reflecting mirror 82 is removed from the optical path to a phantom-line position during the period of far-ultraviolet beam projection. Defined inside a housing 80 are a protective chamber A and a reaction chamber B which communicate through a small opening and the far-ultraviolet beam $LB_1$ is condensed at around the small opening through a condenser lens 83. The housing 80 is formed in its upper wall with an opening of a size which is sufficient for passing the beam $LB_1$. This opening may be provided with a quartz window.

A second light source 84 for emitting a beam of light other than the far-ultraviolet beam comprises for example an Ar laser or $CO_2$ laser. The light beam from the second light source 84 forms a spot on the surface of a wafer 13.

The far-ultraviolet beam $LB_1$ from the first light source 81 is introduced into the housing 80 through the lens 83. At this time, the beam splitter 82 is removed from the optical path. Thus, the wafer 13 is processed photochemically. On the other hand, the laser beam $LB_2$ from the second light source 84 is passed through a polygon mirror 85 and a lens 86, reflected from the beam splitter 82 inserted in the optical path and then condensed on the wafer 13 through the optical system 83. The function of the lens 86 is to cooperate with the lens 83 and adjust the focal length in such a manner that the light beam $LB_2$ is condensed on the wafer 13. The light beam $LB_2$ scans over the wafer 13 in response to the rotation of the polygon mirror 85. By changing the light source 84 and the polygon mirror 85 from their illustrated positions to those displaced by 90° about the optical axis of the lens 86, it is possible, in combination with the reciprocating movement of the beam splitter 82 as shown by the arrows, to effect a two-dimensional scanning of the wafer.

By the foregoing operation, the far-ultraviolet beam $LB_1$ and the light beam $LB_2$ other than the far-ultraviolet beam are alternately projected to the wafer placed in the reactive gas within the chamber B thereby improving the quality of the resulting film.

We claim:

1. An apparatus for processing an element, such as a silicon wafer, by the use of photochemical reaction comprising:

light source means for supplying a light energy;

a housing forming therein a reaction chamber in which said element is arranged, said housing including wall means defining said reaction chamber, said wall means including at least one opening formed therethrough, said element being arranged spatially apart from said opening;

condensing means arranged between said light source means and said reaction chamber and spatially apart from said wall means whereby said light energy is condensed at around said opening and introduced into said reaction chamber; and means for supplying a gas which is photochemically reactive to said light energy into said reaction chamber.

2. An apparatus according to claim 1, further comprising means for adjusting a pressure within said reaction chamber lower than a pressure outside said reaction chamber.

3. An apparatus according to claim 1, wherein said condensing means condenses said light energy at a predetermined size in the vicinity of said opening, and wherein said opening has a size to permit introduction of said condensed light energy into said reaction chamber.

4. An apparatus according to claim 1, wherein said housing includes a protective chamber defined between said condensing means and said wall means to adjoin said reaction chamber, wherein said reaction chamber and said protective chamber are spatially connected through said opening, and wherein said apparatus further comprises means for supplying a gas which is photochemically nonreactive to said light energy into said protective chamber.

5. An apparatus according to claim 1, wherein said element is arranged at a position where said element is exposed to said light energy passed through said opening.

6. An apparatus according to claim 1, wherein said element is arranged outside an optical path of said light energy passed through said opening.

7. An apparatus according to claim 6, further comprising table means having a mounting surface along the optical path of said light energy for mounting said element thereon, and means for rotating a beam of said light energy and element relative to each other about an axis perpendicular to said mounting surface.

8. An apparatus according to claim 7, wherein said condensing means includes a cyclindrical lens having a power in a planar direction parallel to said mounting surface for forming a line image in the vicinity of said opening, and wherein said opening is a slit corresponding to said line image.

9. An apparatus for processing an element, such as a silicon wafer, by the use of photochemical reaction comprising:
light source means for supplying a light energy;
a housing forming therein a reaction chamber in which said element is arranged, said housing including wall means defining said reaction chamber, said wall means including at least one opening formed therethrough, said element being arranged spatially apart from said opening, said reaction chamber being filled with a gas which is photochemically reactive to said light energy; and
condensing means arranged between said light source means and said reaction chamber and spatially apart from said wall means whereby said light energy is condensed at around said opening and introduced into said reaction chamber, wherein said condensing means includes optical integrator means forming a plurality of secondary light sources and lens means for forming an image of each of said plurality of secondary light sources in the vicinity of said wall means, and wherein said wall means includes a plurality of openings formed therethrough and corresponding to said plurality of images.

10. An apparatus for processing an element, such as a silicon wafer, by the use of photochemical reaction comprising:
light source means for supplying a light energy;
a housing forming therein a reaction chamber in which said element is arranged, said housing including wall means defining said reaction chamber, said wall means including at least one opening formed therethrough, and having a first wall surface facing said condensing means and a second wall surface facing said reaction chamber, said first and second wall surfaces being arranged with a predetermined space therebetween, said element being arranged spatially apart from said opening, said reaction chamber being filled with a gas which is photochemically reactive to said light energy;
condensing means arranged between said light source means and said reaction chamber and spatially apart from said wall means whereby said light energy is condensed at around said opening and introduced into said reaction chamber; and
means for supplying into said predetermined space a gas which is photochemically nonreactive to said light energy.

11. An apparatus according to claim 10, further comprising means for supplying said photochemically reactive gas into said reaction chamber.

12. An apparatus for processing an element, such as a silicon wafer, by the use of photochemical reaction comprising:
light source means for supplying a light energy;
a housing forming therein a reaction chamber in which said element is arranged, said housing including wall means defining said reaction chamber, said wall means including at least one opening formed therethrough, said element being arranged spatially apart from said opening, said reaction chamber being filled with a gas which is photochemically reactive to said light energy;
condensing means arranged between said light source means and said reaction chamber and spatially apart from said wall means whereby said light energy is condensed at around said opening and introduced into said reaction chamber; and
means for supplying an energy beam which causes no photochemical reaction of said gas within said reaction chamber, and optical means for directing said energy beam onto said element through said opening.

13. An apparatus according to claim 12, wherein said optical means includes means for scanning over said element with said energy beam.

14. An apparatus according to claim 12, further comprising means for supplying said photochemically reactive gas into said reaction chamber.

15. An apparatus according to claim 12, wherein said housing includes a protective chamber defined between said condensing means and said wall means to adjoin said reaction chamber, wherein said reaction chamber and said protective chamber are spatially connected through said opening, and wherein said apparatus further comprises means for supplying a gas which is photochemically nonreactive to said light energy into said protective chamber.

* * * * *